United States Patent [19]
Prall et al.

[11] Patent Number: 5,780,920
[45] Date of Patent: *Jul. 14, 1998

[54] METHOD OF FORMING A RESISTOR AND INTEGRATED CIRCUITRY HAVING A RESISTOR CONSTRUCTION

[75] Inventors: Kirk Prall; Pierre C. Fazan; Aftab Ahmad; Howard E. Rhodes; Werner Juengling; Pai-Hung Pan; Tyler Lowrey, all of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 680,332

[22] Filed: Jul. 11, 1996

Related U.S. Application Data

[62] Division of Ser. No. 539,876, Oct. 6, 1995.

[51] Int. Cl.$^6$ .................................................. H01L 29/00
[52] U.S. Cl. ............................ 257/536; 257/537; 257/538
[58] Field of Search ............................... 257/536, 537, 257/538, 542, 358, 363

[56] References Cited

U.S. PATENT DOCUMENTS

| | | | |
|---|---|---|---|
| 3,729,662 | 4/1973 | Langdon | 317/235 R |
| 4,432,008 | 2/1984 | Maltiel | 357/51 |
| 4,497,106 | 2/1985 | Momma | 29/571 |
| 4,898,837 | 2/1990 | Takeda | 437/31 |
| 4,912,053 | 3/1990 | Schrantz | 437/29 |
| 5,059,549 | 10/1991 | Furuhata | 437/59 |
| 5,168,076 | 12/1992 | Godinho | 437/60 |
| 5,200,358 | 4/1993 | Bollinger | 437/180 |
| 5,210,438 | 5/1993 | Nakamura | 257/536 |
| 5,244,835 | 9/1993 | Hachiya | 437/186 |
| 5,275,963 | 1/1994 | Cederbaum | 437/48 |
| 5,292,728 | 3/1994 | Endo | 29/571 |
| 5,364,817 | 11/1994 | Lur et al. | 437/192 |
| 5,489,547 | 2/1996 | Erdeljac | 437/60 |

FOREIGN PATENT DOCUMENTS

| | | | |
|---|---|---|---|
| 57-196573 | 12/1982 | Japan | 437/162 |
| 60-231354 | 11/1985 | Japan | 437/60 |

Primary Examiner—Sara W. Crane
Assistant Examiner—Douglas A. Wille
Attorney, Agent, or Firm—Wells, St. John, Roberts, Gregory & Matkin, P.S.

[57] ABSTRACT

A method of forming a resistor from semiconductive material includes, a) providing a substrate; b) providing a layer of semiconductive material over the substrate; c) providing a pair of openings into the semiconductive material layer; d) plugging the pair of openings with an electrically conductive material to define a pair of electrically conductive pillars within the semiconductive material, the pair of pillars having semiconductive material extending therebetween to provide a resistor construction; and e) providing a conductive node to each of the electrically conductive pillars. An integrated circuit incorporating a resistor construction includes, i) a layer of semiconductive material; ii) a pair of electrically conductive pillars provided within the semiconductive material layer, the pair of pillars being separated from one another and thereby having a mass of the semiconductive material extending therebetween; and iii) an electrically conductive node in electrical connection with each of the respective conductive pillars. Alternately, a resistor is provided within a semiconductive substrate using different concentration diffusion regions.

19 Claims, 5 Drawing Sheets

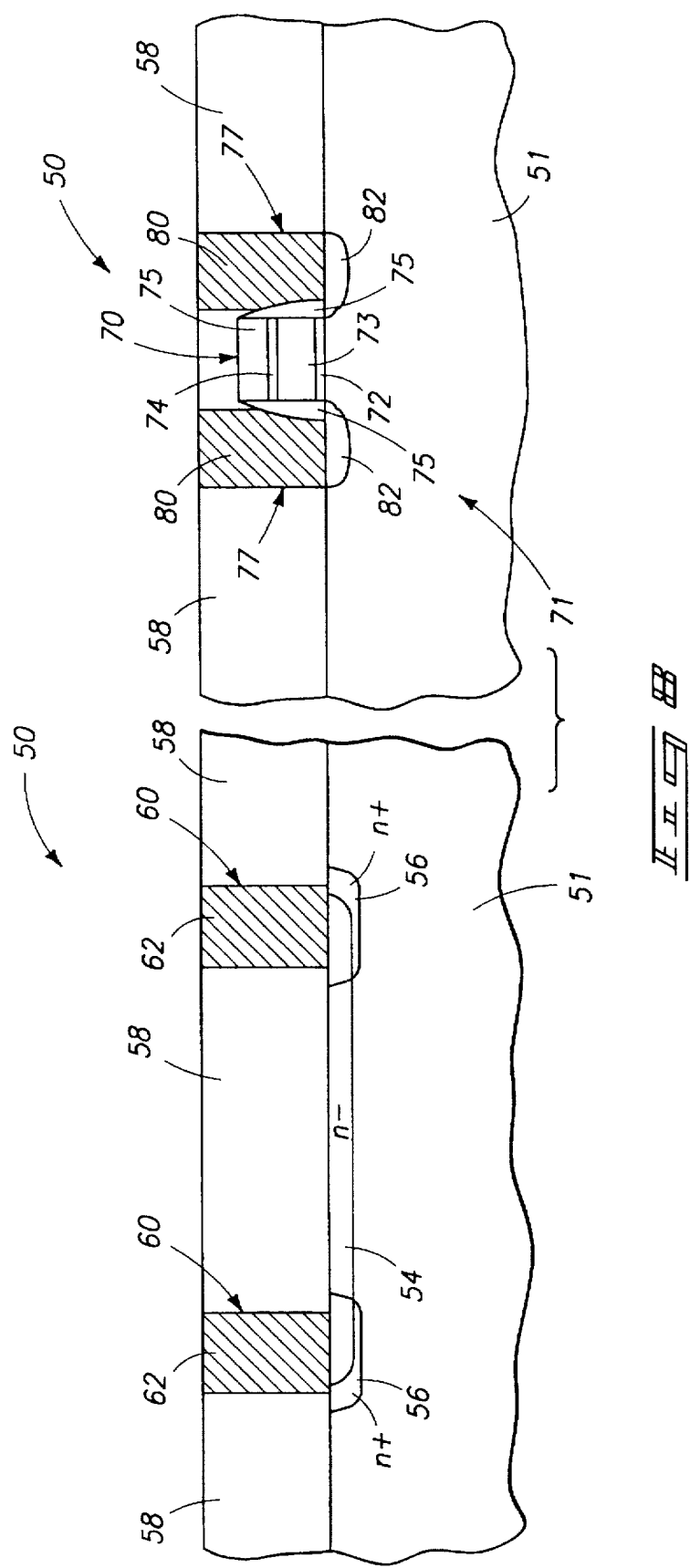

5,780,920

METHOD OF FORMING A RESISTOR AND INTEGRATED CIRCUITRY HAVING A RESISTOR CONSTRUCTION

RELATED PATENT DATA

This is a divisional application of U.S. patent application Serial No. 08/539,876, filed on Oct. 6, 1995, entitled "Method of Forming a Resistor and Integrated Circuitry having a Resistor Construction" naming as inventors Kirk Prall, Pierre C. Fazan, Aftab Ahmad, Howard E. Rhodes, Werner Juengling, Pai-Hung Pan, and Tyler Lowrey, and assigned to the assignee hereof. This application is also related to the following applications: U.S. patent application Ser. No. 08/679,705 which is a divisional of U.S. patent application Ser. No. 08/539,876; and U.S. patent application Ser. No. 08/679,945 which is a file wrapper continuation application of application Ser. No. 08/539,876.

TECHNICAL FIELD

This invention relates generally to semiconductor processing methods of forming resistors from semiconductive material, and to intergrated circuitry incorporating resistors.

BACKGROUND OF THE INVENTION

Resistors in integrated circuitry are typically implemented using either diffused regions in a semiconductor substrate, such as silicon, or provided in deposited thin-films.

This invention comprises novel methods of forming resistors, and novel integrated circuitry incorporating resistors.

BRIEF DESCRIPTION OF THE DRAWINGS

Preferred embodiments of the invention are described below with reference to the following accompanying drawings.

FIG. 8 is an expanded view of the FIG. 7 wafer at a processing step subsequent to that shown by FIG. 7.

DETAILED DESCRIPTION OF THE PREFERRED EMBODIMENTS

Figure 1:
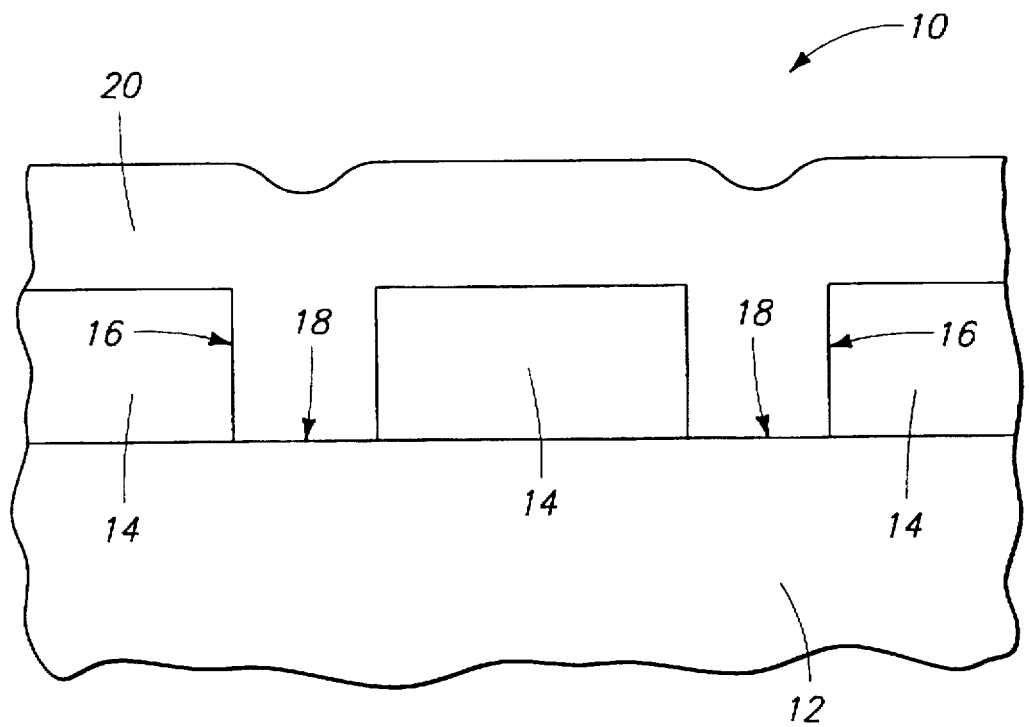
FIG. 1 is a diagrammatic cross sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a method of forming a resistor from semiconductive material comprises the following steps:

providing a substrate;

providing a layer of semiconductive material over the substrate;

providing a pair of openings into the semiconductive material layer;

plugging the pair of openings with an electrically conductive material to define a pair of electrically conductive pillars within the semiconductive material, the pair of pillars having semiconductive material extending therebetween to provide a resistor construction; and providing a conductive node to each of the electrically conductive pillars.

In accordance with another aspect of the invention, an integrated circuit comprises:

a layer of semiconductive material;

a pair of electrically conductive pillars provided within the semiconductive material layer, the pair of pillars being separated from one another and thereby having a mass of the semiconductive material extending therebetween; and an electrically conductive node in electrical connection with each of the respective conductive pillars.

In accordance with still a further aspect of the invention, a method of forming a resistor from semiconductive material comprises:

providing a semiconductive substrate;

providing a conductivity enhancing impurity of a first type into a first region of the semiconductive substrate to a first electrically resistive dopant concentration;

providing a spaced pair of second diffusion regions of conductivity enhancing impurity of the first type within the semiconductive substrate to a second electrically conductive dopant concentration, the spaced second diffusion regions contacting the first region and having first region semiconductive material extending therebetween;

providing an insulating layer outwardly of the semiconductive substrate over the first region;

providing a pair of openings into the insulative layer to the semiconductive substrate, the respective openings overlying the pair of second regions; and plugging the pair of openings with an electrically conductive material.

In accordance with another aspect of the invention, an integrated circuit comprises:

a semiconductive substrate;

a first diffusion region of a conductivity enhancing impurity of a first type within the semiconductive substrate having a first electrically resistive dopant concentration;

a spaced pair of second diffusion regions of conductivity enhancing impurity of the first type within the semiconductive substrate having a second electrically conductive dopant concentration, the spaced second diffusion regions contacting the first diffusion region and having first diffusion region semiconductive material extending therebetween;

an insulating layer outwardly of the semiconductive substrate over the first diffusion region; and a pair of electrically conductive plugs provided through the insulating layer over and in electrical connection with the second diffusion regions.

These and other aspects of the invention will be appreciated from the following description with respect to several preferred embodiments.

Referring to FIG. 1, a semiconductor wafer fragment in process is indicated generally with reference numeral 10. Such comprises a bulk semiconductive substrate 12, typically comprising lightly doped monocrystalline silicon. A layer 14 of semiconductive material is provided over substrate 12. A typical and preferred material is silicon, such as polysilicon, having a conductivity enhancing dopant concentration of less than or equal to $1 \times 10^{19}$ ions/cm$^3$. A preferred conductivity enhancing dopant concentration for layer 14 is from $1 \times 10^{15}$ ions/cm$^3$ to $1 \times 10^{19}$ ions/cm$^3$. An example preferred thickness for layer 14 is 1000 Angstroms to 5000 Angstroms. Layer 14 has been patterned to provide a pair of openings 16 into and through semiconductive material layer 14 to substrate 12. Openings 16 define respective opening bases 18 where openings 16 meet semiconductive substrate 12.

A layer 20 of electrically conductive material is provided over layer 14 to a thickness at least twice as wide as openings 16 to plug such openings 16. An example thickness for layer 20 is 3000 Angstroms to 8000 Angstroms. One example preferred material for layer 20 is polysilicon having a conductivity dopant concentration of at least $1 \times 10^{20}$ ions/cm$^3$. An alternate preferred material is tungsten.

Figure 2:
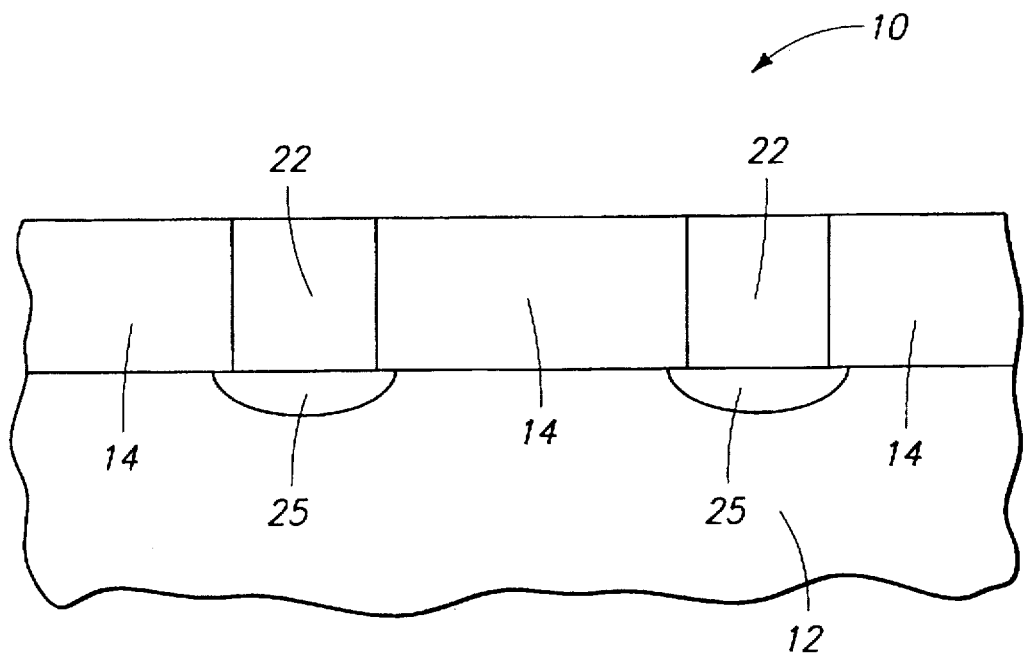
FIG. 2 is a view of the FIG. 1 wafer at a processing step subsequent to that shown by FIG. 1.

Referring to FIG. 2, layer 20 is etched back, either by resist etch back or chemical-mechanical polishing (CMP), to effectively define a pair of electrically conductive pillars 22 of material 20 within semiconductive material 14. Thus, pillars 22 have semiconductive material of layer 14 extending therebetween to provide a predefined resistance path between pillars 22, and thus a resistor construction. The upper surfaces of pillars 22 are flush with the upper surface of semiconductive layer 14. Conductive nodes 25 are provided within semiconductive substrate 12 at bases 18 of each opening 16. The illustrated and preferred technique by which such conductive diffusion regions are provided is substantially by out-diffusion of conductivity enhancing dopant impurity from polysilicon plugging material 22.

Figure 3:
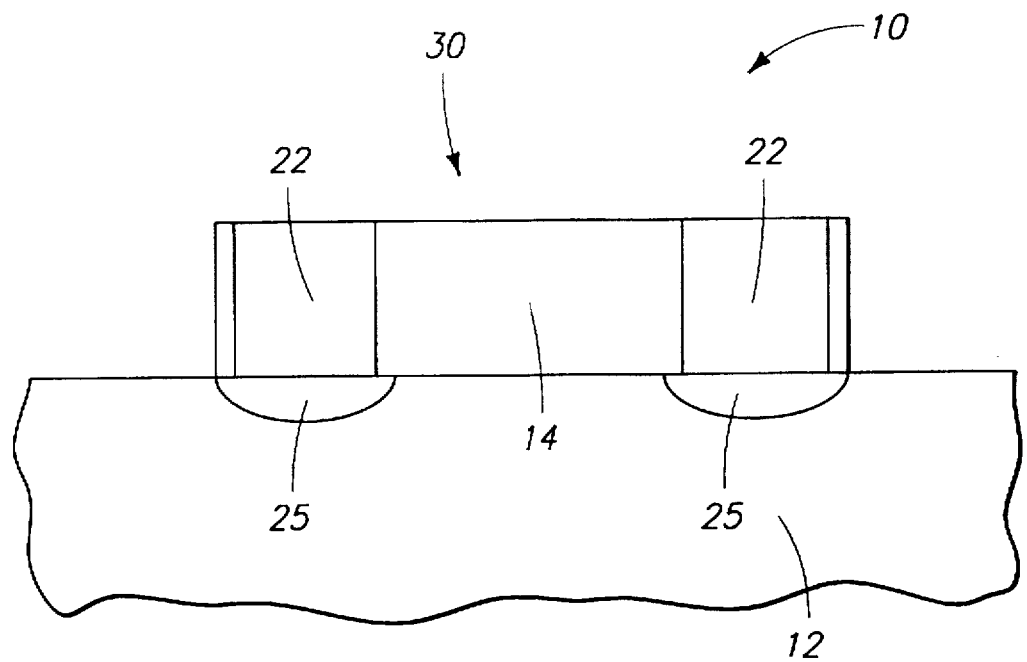
FIG. 3 is a view of the FIG. 1 wafer at a processing step subsequent to that shown by FIG. 2.

Referring to FIG. 3, semiconductive material layer 14 is patterned into a desired resistor shape 30, with the shape comprising the pair of pillars 22 having semiconductive material 14 extending therebetween. Thus, an integrated circuit comprising a resistor construction is provided. Such comprises a layer of semiconductive material, and a pair of electrically conductive pillars provided therewithin. The pair of pillars is separated from one another, and thereby has a mass of the semiconductor material extending therebetween. Electrically conductive nodes, in the form of diffusion regions 25, are in electrical connection with each of the respective conductive pillars.

Figure 4:
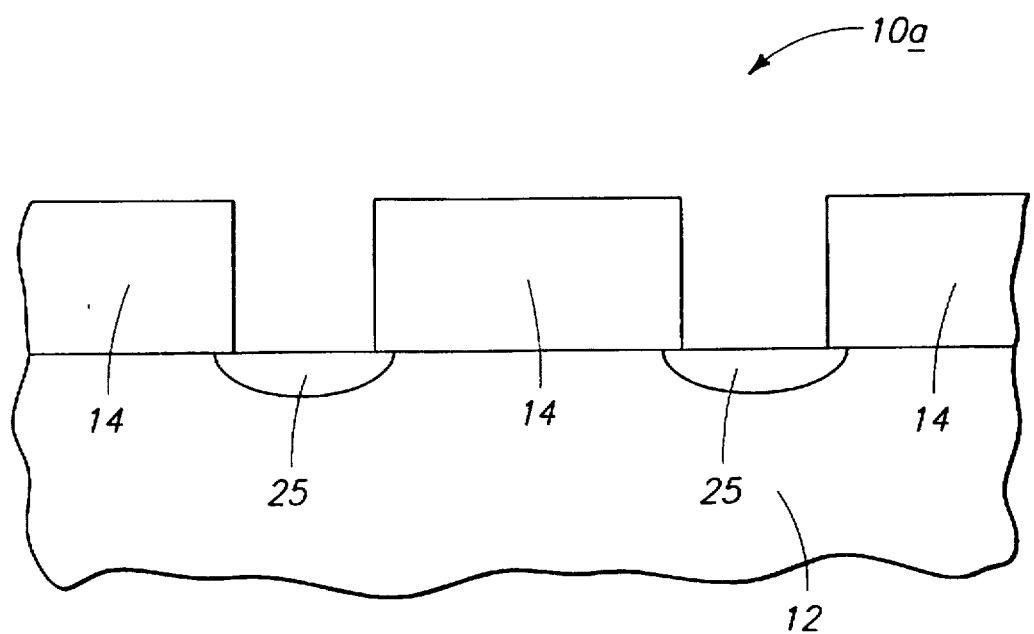
FIG. 4 is a diagrammatic cross sectional view of an alternate embodiment semiconductor wafer fragment at a processing step in accordance with the invention.

FIG. 4 illustrates an alternate embodiment wafer fragment 10a. Here, substrate nodes 25 are provided by a conductivity enhancing doping into substrate 12 through openings 16 prior to the plugging of openings 16.

Figure 5:
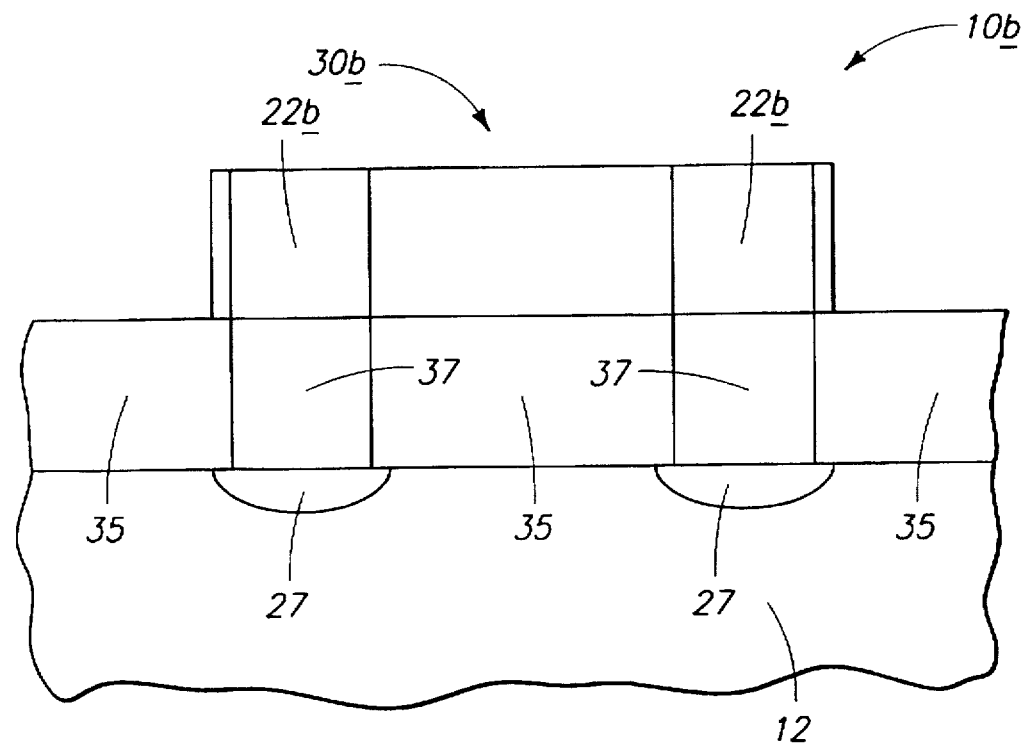
FIG. 5 is a diagrammatic cross sectional view of yet another alternate embodiment semiconductor wafer fragment in accordance with the invention.

FIG. 5 illustrates yet another alternate embodiment wafer fragment 10b. Here, a resistor construction 30b is provided atop a substrate comprising a layer 35 of borophosphosilicate (BPSG). A pair of separate pillars 37, preferably comprising either conductively doped polysilicon or tungsten, is provided through layer 35 to a pair of nodes 27 formed within bulk substrate 12. Pillars 37 constitute nodes which respectively connect to resistor pillars 22b.

Figure 6:
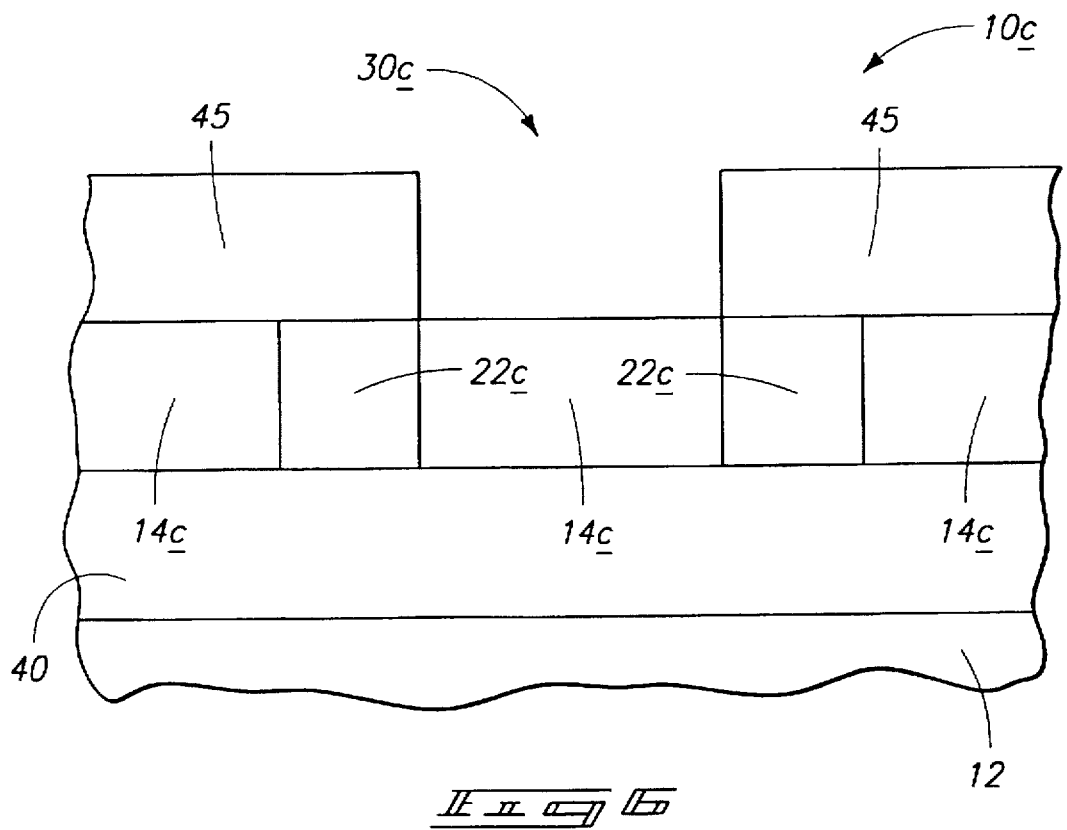
FIG. 6 is a diagrammatic cross sectional view of still another alternate embodiment semiconductor wafer fragment in accordance with the invention.

FIG. 6 illustrates yet another alternate embodiment wafer fragment 10c. Such comprises a bulk substrate 12 and overlying BPSG layer 40. A layer 14c of semiconductive material is provided atop substrate layer 40, and includes a pair of spaced electrically conductive pillars 22c. Nodes to pillar 22c are provided in the form of a separately provided and patterned interconnect line 45, which is effectively bridged by the illustrated resistor construction 30c. Layer 14c would be patterned to be discontinuous out of the figure to define a discrete resistor shape.

Figure 7:
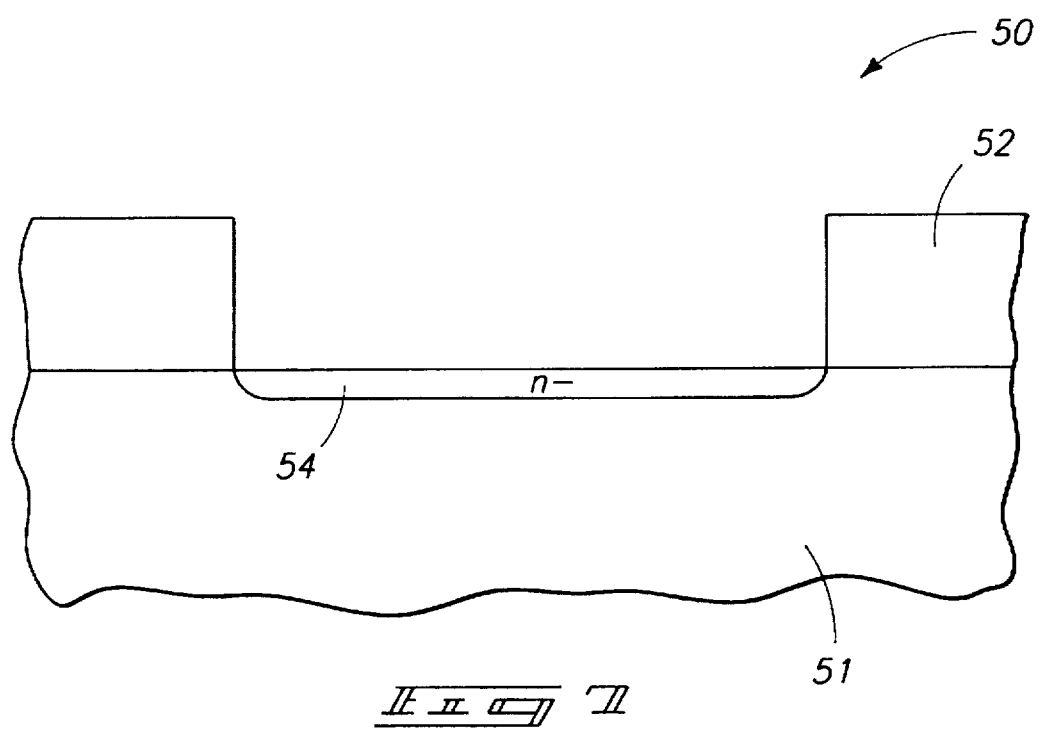
FIG. 7 is a diagrammatic cross sectional view of a further alternate embodiment semiconductor wafer fragment at a processing step in accordance with the invention.

Another inventive embodiment is described with reference to FIGS. 7 and 8. FIG. 7 illustrates a semiconductor wafer fragment 50 comprised of a bulk substrate 51. A layer 52 of photoresist is provided and patterned as shown, and a first diffusion region 54 of a conductivity enhancing impurity of a first type is provided within substrate 51. The illustrated and example conductivity-type impurity is n-type material provided to a first electrically resistive n- dopant concentration, such as preferably less than or equal to $1 \times 10^{19}$ ions/cm$^3$ peak dopant concentration.

Referring to FIG. 8, and initially to the left fragmentary portion of FIG. 8, a spaced pair 56 of second diffusion regions of conductivity enhancing impurity of the first type is provided within semiconductive substrate 51. Second diffusion regions 56 are provided to a second electrically conductive dopant concentration, with an example being at least $1 \times 10^{20}$ ions/cm$^3$. As shown, spaced second diffusion regions 56 contact first diffusion region 54 by overlapping such regions, and accordingly have first diffusion region semiconductive material extending therebetween. Accordingly, region 54 constitutes an expanse of resistive material between higher conductive regions 56. An insulating layer 58 is provided outwardly of semiconductive substrate 51 over first diffusion region 54. A pair of contact openings 60 are provided into insulating layer 58 to semiconductive substrate 51, and overlie second diffusion regions 56. A pair of electrically conductive plugs 62 are provided within contact openings 60 for electrical connection with highly doped diffusion regions 56. Example and preferred materials for plug 62 include tungsten or highly conductively doped polysilicon.

Diffusion regions 56 might be provided by a number of different manners. One example would be provision of diffusion regions 56 essentially entirely by out-diffusion of first conductivity-type material from electrically conductive plugs 62. Alternately, spaced second diffusion regions 56 might be provided prior to the provision of insulating layer 58. For example, the substrate of FIG. 7 could have photoresist layer 52 stripped, and a subsequent layer of photoresist provided. Such subsequent layer could be patterned to provide openings for providing heavy dopant implants to produce regions 56. Further alternately, regions 56 might be provided by implanting through openings 60 after provision of layer 58 and prior to providing conductive plugging material 62.

The right fragmentary portion of FIG. 8 is intended to illustrate processing elsewhere on wafer fragment 50 at least some of which occurs during the same steps as the processing of the illustrated left fragmentary portion. Specifically, a transistor gate 70 in a second region 71 of semiconductive substrate 51 is provided prior to providing insulating layer 58. Gate 71 comprises a gate oxide layer 72, conductive polysilicon layer 73 and higher conductive silicide cap 74. Gate 71 is encapsulated by an insulating material 75 which is selectively etchable relative to insulative layer 58. An example and preferred material, where layer 58 comprises oxide, is $Si_3N_4$. Insulative layer 58 is subsequently provided over insulative material 75 and gate 70.

The step of providing pair of openings 60 for the left portion of FIG. 8 also preferably comprises in the same step etching a pair of contact openings 77 through insulative layer 58 to semiconductive substrate 51 adjacent gate 58 in a manner substantially selective relative to encapsulating insulative material 75. An example etch chemistry where insulative layer 58 is oxide and material 75 is nitride would utilize a combination of $CF_4$, $CHF_3$, Ar, and $CH_2F_2$. A pair of electrically conductive plugs 80 are provided within contact openings 77. Such is preferably accomplished in the same step and in the same manner as provision of plugs 62 within openings 60. A pair of substrate diffusion regions 82 are provided in any of the same manners by which diffusion regions 56 are provided.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. An integrated circuit comprising:

a monocrystalline substrate having an outer surface;

a layer of semiconductive material disposed over said outer surface;

a pair of electrically conductive resistor electrodes formed within and extending through the semiconductive material layer, the pair of resistor electrodes being separated from one another and thereby having a mass of the semiconductive material layer disposed over said outer surface extending therebetween; and a pair of electrically conductive diffusion regions received within the monocrystalline substrate, individual diffusion regions of the pair of regions being in electrical connection with individual respective resistor electrodes of the pair of electrodes, each diffusion region having an uppermost surface which extends no further than said outer surface.

2. The integrated circuit of claim 1 wherein the layer of semiconductive material has an upper surface, and the resistor electrodes have respective upper surfaces which are elevationally coincident with the semiconductive material layer.

3. The integrated circuit of claim 1 wherein the semiconductive material is silicon having a conductivity enhancing dopant concentration of less than or equal to $1\times10^{19}$ ions/$cm^3$.

4. The integrated circuit of claim 1 wherein the electrically conductive resistor electrodes comprise polysilicon having a conductivity enhancing dopant concentration of at least $1\times10^{20}$ ions/$cm^3$.

5. The integrated circuit of claim 1 wherein the electrically conductive resistor electrodes comprise tungsten.

6. The integrated circuit of claim 1 wherein the semiconductive material is silicon having a conductivity enhancing dopant concentration of less than or equal to $1\times10^{19}$ ions/$cm^3$, and the electrically conductive resistor electrodes comprise polysilicon having a conductivity enhancing dopant concentration of at least $1\times10^{20}$ ions/$cm^3$.

7. An integrated circuit comprising:

a substrate having an uppermost surface, the substrate having a pair of spaced electrically conductive diffusion regions provided therein, the diffusion regions having respective uppermost surfaces which are elevationally coincident with the substrate uppermost surface;

a layer of semiconductive material over the substrate uppermost surface; and a pair of electrically conductive resistor electrodes provided within the semiconductive material layer extending entirely therethrough and in electrical connection with the respective diffusion regions, the pair of resistor electrodes being separated from one another and thereby having a mass of the semiconductive material extending laterally therebetween.

8. The integrated circuit of claim 7 wherein the semiconductive material is silicon having a conductivity enhancing dopant concentration of less than or equal to $1\times10^{19}$ ions/$cm^3$.

9. The integrated circuit of claim 1 wherein the electrically conductive resistor electrodes comprise polysilicon having a conductivity enhancing dopant concentration of at least $1\times10^{20}$ ions/$cm^3$.

10. The integrated circuit of claim 1 wherein the electrically conductive resistor electrodes comprise tungsten.

11. The integrated circuit of claim 7 wherein the semiconductive material is silicon having a conductivity enhancing dopant concentration of less than or equal to $1\times1019$ ions/$cm^3$, and the electrically conductive resistor electrodes comprise polysilicon having a conductivity enhancing dopant concentration of at least $1\times10^{20}$ ions/$cm^3$.

12. The integrated circuit of claim 7 wherein the layer of semiconductive material has an upper surface, and the resistor electrodes have respective upper surfaces which are elevationally coincident with the semiconductive material layer.

13. An integrated circuit comprising:

a bulk semiconductive substrate having an outer surface;

a first diffusion region of a conductivity enhancing impurity of a first type disposed within the semiconductive substrate below the outer surface thereof and having a first electrically resistive dopant concentration, the first diffusion region having an uppermost surface which is elevationally coincident with the substrate outer surface;

a spaced pair of second diffusion regions of conductivity enhancing impurity of the first type within the semiconductive substrate having a second electrically conductive dopant concentration, the spaced second diffusion regions contacting the first diffusion region and having first diffusion region semiconductive material extending therebetween;

an insulating layer outwardly of the semiconductive substrate over the first diffusion region; and a pair of electrically conductive electrodes formed through the insulating layer over and in electrical connection with the second diffusion regions.

14. The integrated circuit of claim 13 wherein the first concentration is less than or equal to $1\times10^{19}$ ions/$cm^3$, and the second concentration is at least $1\times10^{20}$ ions/$cm^3$.

15. The integrated circuit of claim 1, wherein said substrate outer surface is locally planar in the vicinity of the diffusion regions, and said uppermost surfaces of said diffusion regions extend no further than said substrate outer surface.

16. The integrated circuitry of claim 15, wherein said uppermost surfaces of said diffusion regions are generally planar.

17. The integrated circuitry of claim 15, wherein said uppermost surfaces of the said diffusion regions are generally planar and elevationally coincident with said substrate outer surface.

18. The integrated circuitry of claim 7, wherein each resistor electrode has a bottommost surface disposed on the uppermost surface of the substrate.

19. The integrated circuitry of claim 13, wherein each of said second diffusion regions has an uppermost surface which is elevationally coincident with the substrate outer surface.

* * * * *

UNITED STATES PATENT AND TRADEMARK OFFICE
CERTIFICATE OF CORRECTION

PATENT NO.    : 5,780,920
DATED         : 07/14/98
INVENTOR(S)   : Monte Manning It is certified that error appears in the above-identified patent and that said Letters Patent is hereby corrected as shown below:

Column 6, line 24, delete "1", and replace with --7--.

Column 6, line 28, delete "1", and replace with --7--.

Column 6, line 32, delete "1019", and replace with --$10^{19}$--

Signed and Sealed this

Twenty-sixth Day of January, 1999

Attest:

Attesting Officer

*Acting Commissioner of Patents and Trademarks*